United States Patent [19]
Fox, Jr. et al.

[11] 3,935,482
[45] Jan. 27, 1976

[54] ELECTRONIC SWITCHING CIRCUIT WITH ZERO VOLTAGE SWITCHING

[75] Inventors: Richard W. Fox, Jr., Marcellus; Jerome R. Mullaly, Baldwinsville, both of N.Y.

[73] Assignee: General Electric Company, New York, N.Y.

[22] Filed: Mar. 14, 1974

[21] Appl. No.: 451,223

[52] U.S. Cl. .... 307/252 B; 307/252 J; 307/252 UA
[51] Int. Cl.² ........................................ H03K 17/72
[58] Field of Search ...... 307/252 UA, 252 B, 252 J; 323/27 SC

[56] References Cited
UNITED STATES PATENTS

| 3,530,309 | 9/1970 | Mabbett | 307/252 J |
| 3,549,905 | 12/1970 | Johnson | 307/252 J |
| 3,723,769 | 3/1973 | Collins | 307/252 UA |
| 3,758,793 | 9/1973 | Pascente | 307/252 UA |

Primary Examiner—John Zazworsky
Attorney, Agent, or Firm—Stephen A. Young; Douglas E. Stoner; Frank L. Neuhauser

[57] ABSTRACT

Disclosed is an electronic switch circuit including a switching thyristor with two switch terminals that are connected to a controlled circuit. A trigger circuit is coupled to the gate terminal of the thyristor to selectively supply trigger signals and the trigger circuit receives its power from a power supply which is connected to switch terminals and draws its energy from the controlled circuit. An energy storage capacitor in the power supply provides trigger energy when the voltage across the switch terminals is approximately zero, such as at A.C. crossovers. The thyristor exhibits zero voltage switching.

12 Claims, 6 Drawing Figures

ELECTRONIC SWITCHING CIRCUIT WITH ZERO VOLTAGE SWITCHING

BACKGROUND OF THE INVENTION

This invention relates to electronic switching circuits and, more particularly, to a circuit for selectively triggering thyristors for controlling A.C. circuits.

Thyristors, such as SCR's and triacs, are becoming ever more popular as replacements for mechanical switches and electro-mechanical relays in the control of A.C. circuits. New uses and more sophisticated applications for thyristors as A.C. power control devices are constantly being developed.

For the past few years there have been different types of "relays" commercially available that utilize thyristors as the active switching element. Recently attention has been focused on maintaining positive isolation between the input and the output of these relays and thereby eliminating feedback normally resulting from their use.

The best input/output isolation available today is in the "optically coupled" relays in which the input circuit comprises a light emitting diode and the trigger circuit for the thyristor comprises a photo responsive component that is optically coupled to the light emitting component. Many of these optically coupled relays adequately provide the much sought after isolation and are being widely utilized by design engineers.

Another advantage provided by the use of a thyristor as a switching element in a relay is derived from the rapidity with which thyristors change state. Initiation of conduction in thyristors is rapid enough that, by employing proper trigger circuitry, thyristors will become conductive only at controlled, preselected times within the cycle of the A.C. voltage to be controlled. Thus, thyristors can be made to turn on only near the A.C. crossovers of the supply voltage. Consequently, problems associated with voltage and current transients incurred following switching are alleviated.

As the aforementioned functional features were designed into solid state relays, the circuits of the relays became more complex. Thus, to summarize, in order to assure adequate isolation of the controlled circuit from other electronic circuits, optical coupling was used. However, this necessitated that the triggering power for the thyristor come from a separate power source or from the controlled circuit. But recall that it was also desired that the thyristor be triggered at substantially zero voltage in the controlled circuit. However, the energy to trigger is not available from the controlled circuit at crossovers. These and other complications prevented prior art zero voltage switching, optically isolated relays from operating as efficiently as desired. For example, many prior "zero voltage switching" relays really switched only near, but never at, zero voltage.

It is, therefore, an object of this invention to provide a control circuit for a zero voltage switching thyristor that functions efficiently, provides true zero voltage switching and is amenable to optical isolation.

SUMMARY OF THE INVENTION

This invention is characterized by an electronic switch circuit including a thyristor switch with two switch terminals that are coupled to a circuit to be controlled. The gate, or trigger terminal of the thyristor is connected to a trigger circuit that selectively supplies a trigger signal to control the thyristor. Power for the trigger circuit is supplied by a power supply with an energy storage device, such as a filter capacitor. The power supply is coupled to and draws its power from the controlled circuit. The filter capacitor also helps supply anode current to the thyristor to initiate conduction near zero crossovers of the input voltage. Consequently, the subject control circuit permits firing of the thyristor even at true zero voltage crossovers.

A feature of the subject invention is that the energy storage capacitor enhances the ability of the thyristor to fire on half cycles immediately following a half cycle during which the thyristor was fired. This is significant inasmuch as the thyristor generally fires for a plurality of sequential half cycles rather than during only isolated half cycles. The particular circuit configuration disclosed below provides this desirable effect by the following process. The energy storage capacitor is discharged through the thyristor when the thyristor fires. Charging of the capacitor during the subsequent half cycle begins immediately following crossover. This is so because the thyristor, as is well known to those skilled in the art, switches off at current crossover thus permitting the capacitor to recharge. The current path through which the capacitor charges includes the thyristor gate when the trigger circuit is set to supply a trigger signal. Thus the capacitor charges through the thyristor gate. As is well known to those skilled in the art, the process of charging a capacitor is characterized by a high initial charging current. Thus, a substantial current to trigger the thyristor is provided very early in the half cycle. If the trigger circuit is not set to supply a trigger signal the charging current bypasses the thyristor gate terminal and the thyristor does not trigger.

Consequently, it will be appreciated that the energy storage capacitor has two primary functions. One, it supplies energy for both the trigger signal and for biasing the thyristor to permit true zero voltage firing. Two, it enhances the available triggering current for the thyristor during half cycles immediately following half cycles during which the thyristor was energized.

DESCRIPTION OF THE DRAWINGS

These and other features and objects of the present invention will become more apparent upon a perusal of the following description taken in conjunction with the accompanying drawings wherein.

DESCRIPTION OF THE PREFERRED EMBODIMENTS

Figure 1:
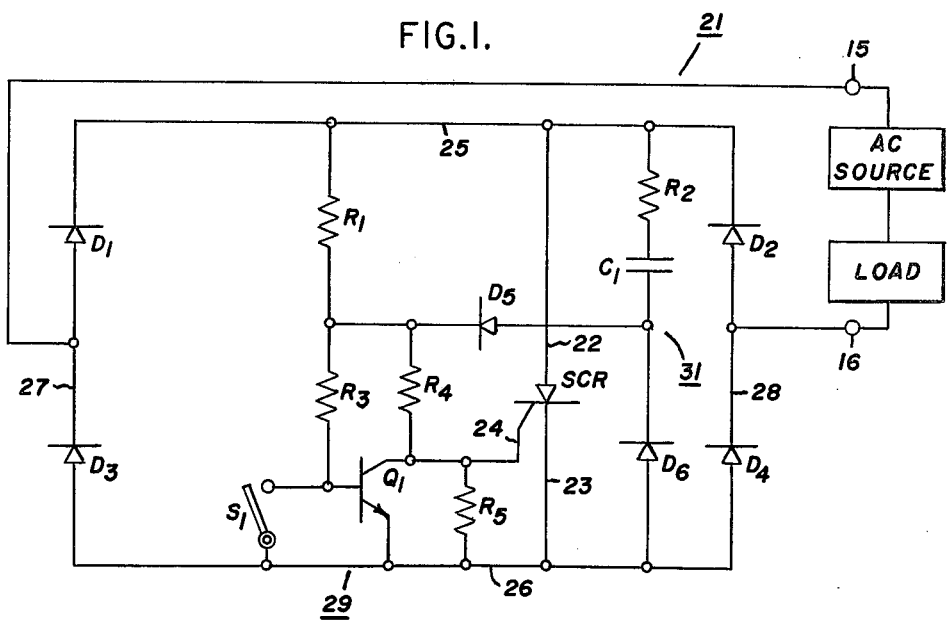
FIG. 1 is a schematic diagram of an electronic switch circuit apparatus constructed in accordance with the subject invention.

Referring first to FIG. 1 there is shown an electronic switch circuit apparatus 21 including a switching thyristor such as a semiconductor controlled rectifier, SCR, that includes two switch terminals 22 and 23 and a trigger, or gate, terminal 24. The switch terminals 22 and 23 are respectively connected to D.C. output terminals 25 and 26 of a full wave bridge rectifier formed by diodes D1, D2, D3 and D4. A circuit to be controlled, consisting, for example, of an A.C. source and a load, is coupled to A.C. input terminals 27 and 28 of the bridge rectifier and connected thereby to the switch terminals 22 and 23. Consequently, when the SCR is on, the terminals 27 and 28 are effectively connected, if diode and SCR foward voltage drops are ignored.

Coupled to the trigger electrode 24 is a trigger circuit 29 that selectively supplies trigger signals and includes resistors R3, R4, and R5 and a transistor Q1. A switch S1 is illustrated coupling the base of the transistor Q1 to the emitter thereof and to the terminal 26. In practice, the switch S1 can be electronic circuitry as is discussed below. However, to gain an understanding of the trigger apparatus 29 it is sufficient to consider the switch S1 as a simple switch such as is shown in FIG. 1.

Coupled to the D.C. output terminals 25 and 26 of the bridge rectifier is a power supply 31 including an energy storage filter capacitor C1. Assuming that the circuit to be controlled is an A.C. circuit, there will be a full wave rectified D.C. appearing between the output terminals 25 and 26. When the voltage on the terminals 25 and 26 exceeds the voltage of the capacitor C1, a charging current flows through the resistor R2, the capacitor C1, a diode D5 and through the trigger circuit 29. In the trigger circuit the current flows to both the resistors R3 and R4. If the switch S1 is open, current flowing through the resistor R3 flows into the base of the transistor Q1. The resistors R3 and R4 are selected to have a value ratio of approximately 20 to 1 and be of a value that causes the transistor Q1 to saturate. Consequently, the current flowing through the resistor R4 flows to the terminal 26 through the transistor Q1. Therefore, the SCR does not fire. (In addition, some current will flow through a resistor R1 but this current also flows through the resistors R3 and R4 and the transistor Q1).

When the voltage differential between the D.C. output terminals 25 and 26 of the bridge falls below the voltage of the capacitor C1, a capacitive discharge current flows through the resistors R1, R2, R3 and R4 and the transistor Q1 to the terminal 26. The discharge current loop is completed from the terminal 26 back to the capacitor C1 by a diode D6.

Operation of the circuit 21 shown in FIG. 1 proceeds as follows. The input terminals 15 and 16 receive an input voltage from a circuit to be controlled, as for example, an A.C. source and load connected in series. With little current flowing through the circuit 21, there is little drop across the load and substantially the entire A.C. source voltage appears across the terminals 15 and 16 as an input voltage. Thus, assuming the switch S1 is open, the input voltage appears as a full wave rectified voltage between the D.C. output terminals 25 and 26 of the bridge. Thus, during the first half cycle the capacitor C1 charges in the aforementioned manner. The SCR does not fire inasmuch as the current flowing through R4 is passed to the terminal 26 by the transistor Q1 rather than by the resistor R5 and the trigger terminal. When the voltage between the terminals 25 and 26 decreases to less than the voltage of the capacitor C1, the capacitor discharges as previously mentioned through the resistors R2 and R1. Again, the SCR does not fire inasmuch as the current passing through the resistor R4 is coupled to the terminal 26 by the transistor Q1. Thus, a current is constantly flowing through the resistor R4 is coupled to the terminal 26 by the transistor Q1. Thus, a current is constantly flowing through the resistor R1, the resistors R3 and R4 and the transistor Q1. Furthermore, due to the presence of the capacitor C1, the switch terminals 22 and 23 of the SCR are constantly forward biased.

Assume that the switch S1 closes. The current that is constantly flowing through the resistor R3 is then conducted to the terminal 26 through the switch S1. Thus, the transistor Q1 turns off and the current flowing through the resistor R4 flows to the terminal 26 through the resistor R5 and the trigger terminal. Thus a trigger signal is applied to the trigger terminal 24 and the SCR turns on. Consequently, the terminals 15 and 16 appear to be a short circuit to the A.C. source and the load.

During the half cycle when the SCR turns on, the capacitor C1 nearly fully discharges through the resistor R2, the SCR and the diode D6. Thus at the next AC crossover, the SCR turns off. The capacitor has now been discharged and thus has no energy available to trigger the SCR. However, the presence of the capacitor C1 enhances the available triggering current on subsequent half cycles. If the capacitor C1 were not present, the triggering current would flow through R1, R4, R5 and the trigger terminal since the switch S1 is still closed and thus the transistor Q1 is still turned off.

The capacitor C1 has the following effect after the SCR has fired. The application of a voltage to a discharged capacitor is characterized by a high initial charging current. Thus, upon the commencement of the following half cycle a substantial capacitor charging current flows through the resistor R2, the capacitor C1, the diode D5 and the resistors R4 and R5 and the trigger terminal. It is this charging current that initially constitutes the major portion of the available trigger current. That is so because the current flowing through R1 builds up slowly in accordance with Ohm's law as the voltage between the terminals 25 and 26 builds up. It will be recalled that it is desirable to fire the SCR as early as possible in each half cycle (closest to crossover) when it is going to fire. The substantial charging current drawn by the capacitor C1 induces firing of the SCR more quickly than firing would occur were a purely resistive current through the resistor R1 used.

In summary, it will be appreciated that the presence of the capacitor C1 insures that firing energy is available for the SCR at all times, including precisely at zero crossovers of the input voltage, and, furthermore, enhances the available trigger current for firing the SCR during successive half cycles.

When the switch S1 is opened the SCR turns off at the next zero current crossover and does not fire again inasmuch as the transistor Q1 becomes conductive. Thus, during the subsequent half cycle the capacitor C1 again charges and retains sufficient energy to properly bias the SCR and have energy available for the initial triggering current when the switch S1 closes.

It should be appreciated that the capacitor C1 need not provide complete filtering action. A substantial amount of A.C. ripple can appear between the terminals 25 and 26 as long as the thyristor is forward biased and sufficient triggering energy is available in the capacitor. The ability of the circuit to tolerate ripple permits the capacitor to be smaller, and thus lighter and less expensive, than it otherwise might be.

Figure 2:
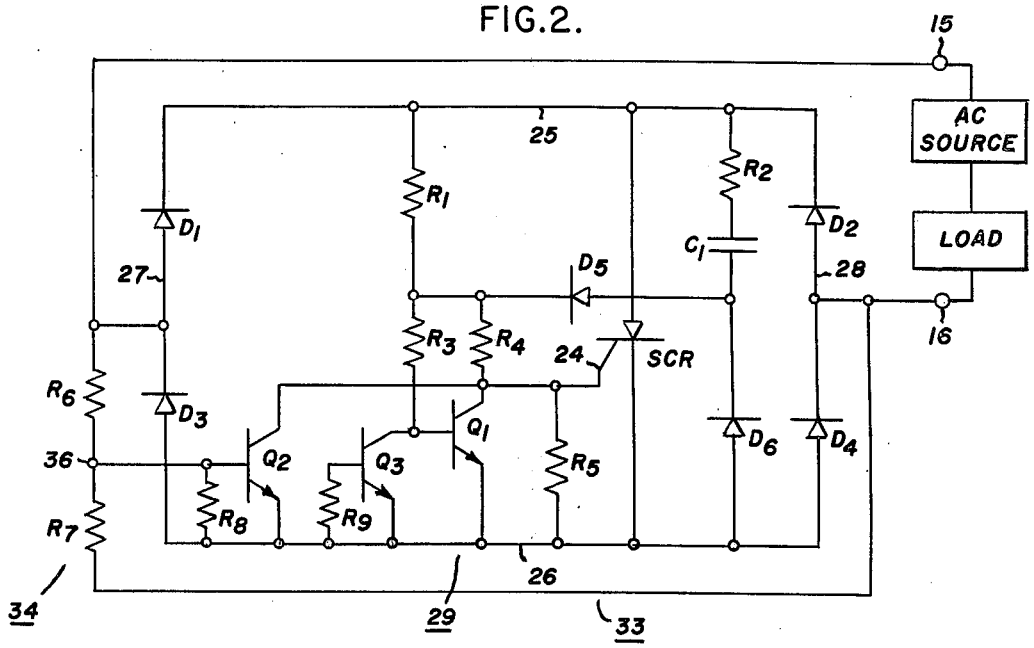
FIG. 2 is a diagram illustrating a more elaborate switch circuit that provides zero voltage triggering.

Referring now to FIG. 2 there is shown a more sophisticated electronic switching circuit 33. Among the changes between the circuits 33 and 21 is the replacement of the switch S1 (FIG. 1) with a radiant energy responsive device such as a photo transistor Q3. Also included is a biasing resistor R9 to establish proper bias conditions on the transistor Q3. The photo transistor Q3 functions as did the switch S1. When radiant energy strikes the transistor Q3, it turns on thus connecting the base of the transistor Q1 to the terminal 26 just as the switch S1 connected the base to the terminal 26. Thus, the trigger apparatus 29 works just as described previously with the exception that it is photo responsive.

Also shown in FIG. 2 is an input responsive inhibit circuit 34 that senses the input voltage at the terminals 15 and 16 and inhibits the trigger circuit 29 so that no trigger signal is supplied to the SCR in the event that the input voltage is without predetermined bounds. Included in the inhibit circuit 34 is a resistive voltage divider circuit for providing a sensor signal indicative of the absolute value of the input voltage. Included in the resistive divider circuit are a first resistive sensing branch R6 coupled from the terminal 27 to a common sensor terminal 36 and a second resistive sensing branch R7 coupled from the common terminal 36 to the terminal 28. Also included is a resistive output sensing branch R8 coupled from the common sensor terminal 36 to the D.C. terminal 26. As will become more apparent below, a sensor signal appears across the output resistive branch R8 that is indicative of the absolute value of the input voltage applied to the terminals 15 and 16.

A transistor Q2 wired to operate as an electronic switch has its control or base electrode coupled to the common sensor terminal 36. Its collector, or, in this circuit, shunting electrode is coupled to the collector of the transistor Q1. Consequently, when the transistor Q2 is conductive, the trigger circuit 29 will not supply a trigger signal to the SCR inasmuch as the would be trigger signal that flows through the resistor R4 is shunted to the terminal 26 by the transistor Q2. Thus, if either the transistor Q1 or the transistor Q2 is conductive, the SCR cannot fire.

Functionally, the base-emitter circuit of the transistor Q2 can be thought of as a threshold detector circuit that turns the transistor on when the sensor signal at the sensor terminal 36 indicates that the input voltage is without the preselected bounds. Further, the collector-emitter circuit of the transistor Q2 can be thought of as a bypass circuit that causes any trigger signal generated to bypass R5 and the SCR gate 24 when the transistor Q2 is activated by the threshold circuit.

Figure 3:
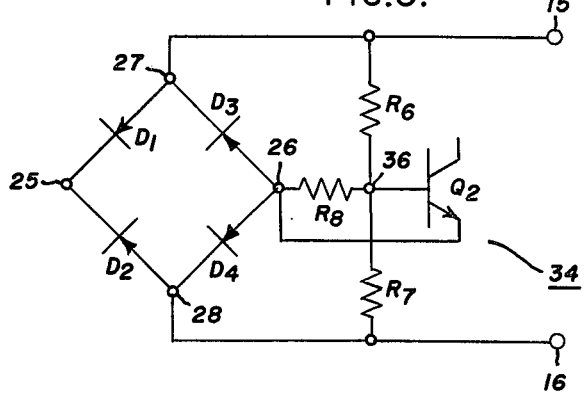
FIG. 3 is a portion of the circuit depicted in FIG. 2 redrawn so as to make more clear the operation of the zero voltage detector system.

Referring now to FIG. 3 there is shown the full wave bridge rectifier and the input voltage responsive inhibit circuit 34 redrawn to be more easily understood. Shown in FIGS. 4 and 5 are portions of that circuit shown in FIG. 3, but wherein FIGS. 4 and 5 only show the components that are conductive during alternate half cycles.

Figure 4:
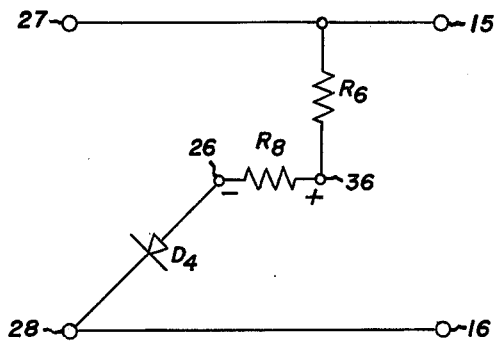
FIGS. 4 and 5 illustrate phases of the operation of the zero crossing threshold detector.

Shown in FIG. 4 is the conduction path that is followed when the terminal 15 is positive with respect to the terminal 16. Current flows from the terminal 15 through the resistor R6 past the common sensor terminal 36 through the resistor R8 and to the terminal 16 through the diode D4. Thus, if the forward voltage drop of the diode D4 is ignored it will be appreciated that a simple two resistor voltage divider is present, with a voltage drop across the resistor R8 as indicated.

Figure 5:
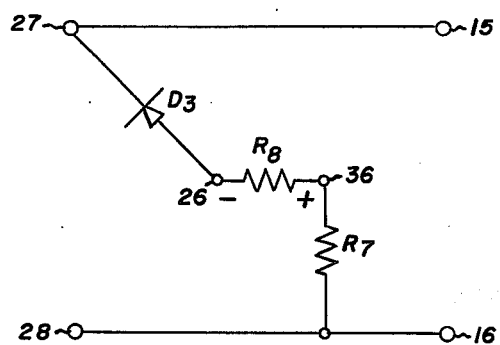

Referring now to FIG. 5 there is shown the corresponding conduction path that is followed when the terminal 16 is positive with respect to the terminal 15. The current flows through the resistor R7, past the common sensor terminal 36, through the resistor R8 and to the terminal 15 through the diode D3. Again, this branch can be likened to a simple two resistor divider circuit and the polarity across the resistor R8 is as indicated. It will be appreciated that if the resistors R6 and R7 are equal in value, the sensor voltage at the terminal 36 will be indicative of the absolute value of the input voltage.

The threshold input voltage at which the transistor Q2 becomes conductive and thus inhibits the trigger circuit 29 is thus determined by proper selection of the resistors R6, R7 and R8 and the turn-on characteristics of the transistor Q2. Selection of proper components for this circuit is deemed well within the abilities of those skilled in electronic circuit design.

The resistive divider had to be "outside" the bridge as shown in FIG. 3 because the voltage between the terminal 25 and 26 is filtered by the capacitor C1. Thus, were the resistive voltage divider inside the full wave bridge, the transistor Q2 would be likely to remain on constantly due to the energy stored in the capacitor C1.

Figure 6:
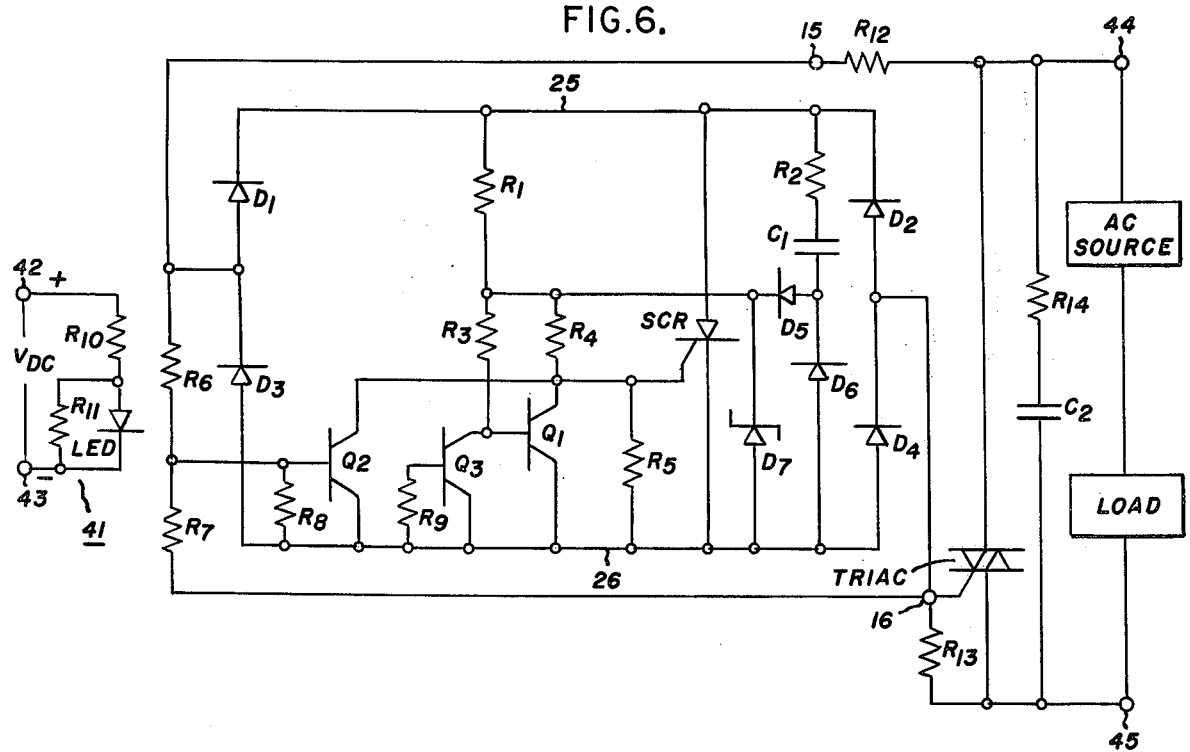
FIG. 6 is a schematic diagram of an optically isolated, zero voltage firing solid state relay.

Referring now to FIG. 6 there is shown a schematic diagram of an optically coupled solid state relay exhibiting zero voltage switching. Essentially, the circuit depicted in FIG. 6 is the same as the circuit shown in FIG. 2 with certain additions. A selectively operable radiant energy source 41 receives power from two D.C. input terminals 42 and 43. Current flowing in the terminal 42 passes through a resistor R10 and thence through a parallel combination of a light emitting diode and a resistor R11. The light emitting diode is optically coupled to the photo transistor Q3. The resistor R10 limits the current passing through the light emitting diode to protect it and the resistor R11 shunts the light emitting diode to establish the turnoff voltage threshold. When a voltage above a predetermined minimum is applied to the terminals 42 and 43, the light emitting diode is activated and turns on the photo transistor Q3 with the effect of closing the switch S1 shown in FIG. 1.

Also added in FIG. 6 is a zener diode D7 to protect the transistors Q1, Q2, and Q3 and diodes D5 and D6 from voltage surges.

Also shown in FIG. 6 are two high current terminals 44 and 45 that are coupled to the input terminals 15 and 16 by divider resistors R12 and R13. Coupled between the terminals 44 and 45 are the anode terminals of a bidirectional triode thyristor or triac, whose gate is coupled to the terminal 16 and is conventionally biased by the resistor R13. Also in parallel with the triac is a snubber circuit composed of a resistor R14 and a capacitor C2.

The circuit depicted in FIG. 2 functions as previously described. However, the overall current supply thereto is limited by the resistors R12 and R13. The voltage divider behavior of the resistors R12 and R13 causes a gate bias for the triac to appear across the resistor R13 when the terminals 15 and 16 are connected. Consequently, when the SCR is activated, the triac is triggered.

During operation of the circuit shown in FIG. 6 a load and an A.C. source are connected in series with the terminals 44 and 45. Initially, assuming that the light emitting diode is not activated, little current flows through either the snubber circuit or the resistors R12 and R13 and thus substantially the entire voltage of the A.C. source appears across the terminals 44 and 45 and 15 and 16. During the first half cycle the capacitor C1 charges as previously described.

When the voltage between the terminals 25 and 26 drops below the voltage in the capacitor C1, the discharge current through the resistor R1 appears as previously described.

When, during each half cycle, the voltage between the terminals 15 and 16, and thus between the terminals 44 and 45, exceeds the predetermined maximum, the resistive voltage divider circuit turns the transistor Q2 on such that its bypass function will be performed in the event that the transistor Q1 is turned off.

Assume that a D.C. input voltage is applied to the terminals 42 and 43 and the light emitting diode is energized. The transistor Q3 turns on and thus diverts the current flowing through the resistor R3 from the base of the transistor Q1. Thus, the transistor Q1 turns off. The current flowing through R4 will either flow through the resistor R5 and the gate terminal 24 or through the transistor Q2, depending upon the input voltage at the terminals 15 and 16. In the event that the input voltage is within the predetermined bounds, the current flowing through the resistor R4 will energize the SCR. In the event that the voltage is without the predetermined bounds, the current will flow through the transistor Q2 but, assuming that the light activated diode remains activated, the SCR will be triggered when the input voltage falls within the predetermined bounds. Energization of the SCR creates substantially a short circuit between the terminals 15 and 16 and thus the triac is turned on and the A.C. source is connected to the load.

At the next A.C. source crossover, the currents through the triac and the SCR drop to zero and thus both devices turn off. However, if the light emitting diode is still activated, the transistor Q1 remains off and the transistor Q2 is off inasmuch as the input voltage near crossover is within the predetermined bounds. Consequently, the SCR will quickly be triggered due to the enhanced triggering current that results from the charging of the capacitor C1 as previously mentioned. Again, upon the triggering of the SCR, the triac is triggered and thus the A.C. source is again connected to the load. Operation continues with the SCR and the triac being turned on each half cycle until the light emitting diode is inactivated.

Another desirable feature of this invention is that "half waving" is prevented. Half waving is a condition in which the light emitting diode remains activated but the SCR, and thus the triac, are triggered only on alternate half cycles. This is generally an undesirable condition that sometimes occurs inadvertently due to component dissimilarities which create uneven sensitivity to alternate half cycles of the input voltage. Half waving is most likely when the light emitting diode is energized at a low level and the photo responsive transistor Q3 is not saturated.

The subject circuit prevents half waving inasmuch as the photo transistor Q3 is biased to be more easily saturated following a half cycle during which the SCR was triggered. This is so because initial triggering requires that the transistor Q3 shunt a substantial current flowing from the capacitor C1. Following firing of the SCR, the capacitor C1 is discharged as previously mentioned. Thus, the current flowing through the resistor R3 during the following half cycle builds up from zero. As was mentioned previously, the current builds up from zero faster than a purely resistive current due to the presence of the capacitor C1 but, nevertheless, the current must build from zero. The amount of light required by the transistor Q3 to shunt a given current is approximately equal to that current divided by Beta. Consequently, if less current need by shunted by the transistor Q3, less light is necessary to saturate the transistor and perform the shunting operation. Inasmuch as the current through R3 is lower during the early stages of half cycles following the firing of the SCR, less light is required to turn the transistor Q3 on and thus fire the SCR again. Consequently, half waving is prevented.

By way of example, the following component values are found effective for 120 volt operation:

| | |
|---|---|
| R1 | 120K ohm |
| R2 | 1K ohm |
| R3 | 100K ohm |
| R4 | 4.7K ohm |
| R5 | 47K ohm |
| R6 | 120K ohm |
| R7 | 120K ohm |
| R8 | 33K ohm |
| C1 | .022 mf |

For 240 volt operation, the following substitutions are found to provide improvement.

| | |
|---|---|
| R1 | 240K ohm |
| R6 | 240K ohm |
| R7 | 240K ohm |
| C1 | .033 mf |

In view of the foregoing, many modifications and variations of the present invention will be obvious to those skilled in the art. For example, an A.C. responsive input could be used. Or, a light activated SCR could be optically coupled to the light emitting diode and connected to trigger the triac. It is to be understood, therefor, that the true scope of the invention is only as limited by the following claims.

What is claimed is:

1. Electronic switch circuit apparatus comprising:
   input terminals coupled to an A.C. controlled circuit;
   a switching thyristor comprising two switch terminals electrically coupled to said input terminals and also comprising a trigger terminal for receiving a trigger signal, said thyristor controlling the controlled circuit in response to trigger signals received at said trigger terminal;
   trigger means coupled to said trigger terminal for selectively supplying trigger signals;
   power supply means including a capacitor and a rectifier, said rectifier being coupled to said switch terminals and drawing power from the controlled circuit;
   means electrically coupling said capacitor to said trigger means for supplying stored power to generate an initial trigger signal before said thyristor has been fired, and for enhancing the power to generate a subsequent trigger signal after said thyristor has been extinguished and while said capacitor begins to recharge; and
   means electrically coupling said capacitor across said switch terminals for enabling said capacitor to discharge through said thyristor immediately after said thyristor fires in response to a trigger signal.

2. Apparatus according to claim 1 wherein said rectifier is a full wave rectifier, and wherein said apparatus further comprises input responsive inhibit means for sensing the input voltage at said input terminals and for inhibiting switching of said thyristor if the input voltage falls without preselected bounds.

3. Apparatus according to claim 2 wherein said input responsive inhibit means comprises bypass means for causing any trigger signal generated when the input voltage is without said preselected bounds to bypass said trigger terminal.

4. Apparatus according to claim 3 wherein said input responsive inhibit means comprises threshold detector means for activating said bypass means when the absolute value of the input voltage exceeds a preselected maximum.

5. Apparatus according to claim 4 wherein said full wave rectifier is a bridge rectifier having two D.C. output terminals and said input responsive inhibit means comprises resistive divider means for sensing the absolute value of the input voltage, said divider means comprising:
   a first sensing resistive branch coupled to a common sensor terminal and one of said input terminals;
   a second sensing resistive branch coupled to said common sensor terminal and the other one of said input terminals; and
   an output resistive branch coupled to said common sensor terminal and to one of said D.C. output terminals, and wherein a sensor voltage indicative of the absolute value of the input voltage appears across said output resistive branch.

6. Apparatus according to claim 5 wherein said threshold detector means comprises an electronic switch having a control electrode coupled to said common terminal and a shunting electrode coupled to said trigger terminal for performing the bypass operation when the sensor voltage indicates the input voltage exceeds said preselected maximum.

7. Apparatus according to claim 6 wherein said electronic switch is a transistor and said control electrode is the base and said shunting electrode is the collector.

8. Apparatus according to claim 1 further including a high current switch connected to said input terminals for correspondingly switching current between a pair of high current terminals in direct accordance with the flow of current between said input terminals.

9. Apparatus according to claim 8 wherein:
   a. said high current switch comprises a bidirectional triode thyristor having first and second anode electrodes and a gate electrode, the first and second anode electrodes being connected to said high current terminals;
   b. the gate electrode of said bidirectional triode thyristor being electrically connected to one of said input terminals; and further including
   c. a voltage divider connected between said high current terminals and having an intermediate junction electrically connected to the other of said input terminals.

10. Apparatus according to claim 1 wherein said trigger means further comprises radiant energy responsive means for selectively inducing trigger signals in response to the receipt of radiant energy, and wherein said apparatus further comprises selectively operable radiant energy source means that is operatively coupled to said radiant energy responsive means for selectively supplying radiant energy thereto.

11. Apparatus according to claim 10 further including a high current switch connected to said input terminals for correspondingly switching current between a pair of high current terminals in direct accordance with the flow of current between said input terminals.

12. Apparatus according to claim 11 wherein:
   a. said high current switch comprises a bidirectional triode thyristor having first and second anode electrodes and a gate electrode, the first and second anode electrodes being connected to said high current terminals;
   b. the gate electrode of said bidirectional triode thyristor being electrically connected to one of said input terminals; and further including
   c. a voltage divider connected between said high current terminals and having an intermediate junction electrically connected to the other of said input terminals.

* * * * *